US010467937B2

(12) United States Patent
Dong et al.

(10) Patent No.: US 10,467,937 B2
(45) Date of Patent: Nov. 5, 2019

(54) SHIFT REGISTER UNIT, DRIVING METHOD THEREOF, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Dianzheng Dong, Beijing (CN); Bin Zhang, Beijing (CN); Ming Tian, Beijing (CN); Qiang Zhang, Beijing (CN); Guangxing Wang, Beijing (CN); Kan Zhang, Beijing (CN); Pengming Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/577,740

(22) PCT Filed: May 10, 2017

(86) PCT No.: PCT/CN2017/083694
§ 371 (c)(1),
(2) Date: Nov. 28, 2017

(87) PCT Pub. No.: WO2018/000945
PCT Pub. Date: Jan. 4, 2018

(65) Prior Publication Data
US 2018/0293925 A1 Oct. 11, 2018

(30) Foreign Application Priority Data
Jun. 30, 2016 (CN) .......................... 2016 1 0512805

(51) Int. Cl.
G09G 3/20 (2006.01)
G11C 19/28 (2006.01)
G11C 19/18 (2006.01)

(52) U.S. Cl.
CPC ............. *G09G 3/20* (2013.01); *G11C 19/184* (2013.01); *G11C 19/28* (2013.01);
(Continued)

(58) Field of Classification Search
CPC ............................................. G09G 2320/0219
See application file for complete search history.

(56) References Cited

U.S. PATENT DOCUMENTS 6,052,426 A * 4/2000 Maurice ............... G09G 3/3677
377/78
6,919,874 B1 * 7/2005 Maurice ............... G09G 3/3677
345/100

(Continued)

FOREIGN PATENT DOCUMENTS

CN 101593561 A 12/2009
CN 202487125 U 10/2012

(Continued)

OTHER PUBLICATIONS

International Search Report received for PCT Patent Application No. PCT/CN2017/083694, dated Jul. 20, 2017, 7 pages (3 pages of English Translation and 4 pages of Original Document).

(Continued)

*Primary Examiner* — Priyank J Shah
(74) *Attorney, Agent, or Firm* — Womble Bond Dickinson (US) LLP

(57) ABSTRACT

The disclosure discloses a shift register unit, a driving method thereof, a gate driving circuit and a display device. The shift register unit comprises an input circuit, a reset circuit, a control circuit, a pull-down circuit and an output (Continued)

circuit, a first control terminal of the output circuit is coupled to a first node, its first input terminal is coupled to a second clock signal terminal, its first output terminal is coupled to a signal output terminal, both terminals of the pull-down circuit are coupled to a first clock signal terminal and the first node, respectively, and the pull-down circuit may pull down the potential of the first node via the first clock signal terminal, which may thus avoid that the potential of the first node also rises when the potential of the second clock signal terminal rises, and the signal of the second clock signal terminal is mistakenly provided to the signal output terminal to cause various poor display.

20 Claims, 8 Drawing Sheets

(52) U.S. Cl.
CPC .............. *G09G 2310/0286* (2013.01); *G09G 2310/061* (2013.01); *G09G 2310/08* (2013.01); *G09G 2320/0219* (2013.01)

(56) References Cited

U.S. PATENT DOCUMENTS

| | | | | |
|---|---|---|---|---|
| 7,460,634 | B2* | 12/2008 | Deane | G09G 3/3677 377/64 |
| 9,018,590 | B2* | 4/2015 | Blanchon | H04N 5/3452 250/370.09 |
| 9,679,512 | B2* | 6/2017 | Zhang | G09G 3/2092 |
| 10,140,911 | B2* | 11/2018 | Zhang | G09G 3/2092 |
| 2005/0220263 | A1* | 10/2005 | Moon | G11C 19/00 377/68 |
| 2011/0286572 | A1* | 11/2011 | Shang | G11C 19/28 377/67 |
| 2012/0139883 | A1 | 6/2012 | Lee et al. | |
| 2014/0071104 | A1* | 3/2014 | Gao | G11C 19/28 345/208 |
| 2014/0169518 | A1* | 6/2014 | Kong | G09G 3/3674 377/64 |
| 2015/0302935 | A1* | 10/2015 | Zeng | G09G 3/20 377/64 |
| 2016/0049107 | A1* | 2/2016 | Hsu | G09G 3/20 345/212 |
| 2016/0055814 | A1* | 2/2016 | Yang | G09G 3/3677 345/213 |
| 2016/0133337 | A1* | 5/2016 | Gu | G11C 19/28 377/64 |
| 2017/0046998 | A1 | 2/2017 | Zhang et al. | |
| 2017/0301276 | A1* | 10/2017 | He | G09G 3/2092 |

FOREIGN PATENT DOCUMENTS

| | | |
|---|---|---|
| CN | 202502720 U | 10/2012 |
| CN | 104616617 A | 5/2015 |
| CN | 105047127 A | 11/2015 |
| CN | 106057118 A | 10/2016 |

OTHER PUBLICATIONS

Office Action received for Chinese Patent Application No. 201610512805.3, dated Feb. 13, 2018, 14 pages (7 pages of English Translation and 7 pages of Office Action).

* cited by examiner

SHIFT REGISTER UNIT, DRIVING METHOD THEREOF, GATE DRIVING CIRCUIT AND DISPLAY DEVICE

RELATED APPLICATION

The present application is the U.S. national phase entry of PCT/CN2017/083694, with an international filing date of May 10, 2017, which claims the benefit of Chinese Patent Application No. 201610512805.3 filed on Jun. 30, 2016, the entire disclosures of which are incorporated herein by reference.

TECHNICAL FIELD

The disclosure relates to the field of display technology, and in particular, to a shift register unit, a driving method thereof, a gate driving circuit and a display device.

BACKGROUND

In display panels, a gate driving signal is generally provided to the gate of an individual thin film transistor (TFT) of a pixel area via a gate driving circuit. The gate driving circuit may be integrated on an array substrate of a display panel by an array process, i.e., the gate driver on array (GOA) process. Such an integration process not only saves cost, but may also achieve an aesthetic design in which both sides of the display panel are symmetric, and meanwhile, also omits the binding area for the gate driving circuit and the fan-out wiring space, which may thus implement a narrow border design, moreover, such an integration process may further omit the binding process in the direction of gate scanning lines, and thereby improves the productivity and yield.

Nowadays, in shift register units at each stage in an existing gate driving circuit, the current of the control clock signal CLK loaded to a TFT of the signal output terminal Output is relatively large, the size of the TFT is relatively large, and the parasitic capacitance of the TFT is relatively large. When the potential of the clock signal CLK inputted at the source of the TFT changes from low level to high level, since the TFT has a relatively large parasitic capacitance, the potential of the gate of the TFT will be caused to rise too, which will thus cause the TFT to be erroneously turned on, and as such, the clock signal CLK inputted at the source of the TFT will be erroneously provided to the signal output terminal Output which is coupled to the drain of the TFT, and then poor display such as picture abnormality, black screen, etc. will be caused to occur to the display panel.

Therefore, how to avoid the TFT error turn-on that the control clock signal is loaded to the signal output terminal is a technical problem that urgently needs to be solved by the skilled in the art.

SUMMARY

Therefore, an embodiment of the disclosure provides a shift register unit comprising: an input circuit, a reset circuit, a control circuit, a pull-down circuit and an output circuit, wherein a first control terminal of the input circuit and the input terminal of the input circuit are coupled to a signal input terminal, respectively, a second control terminal of the input circuit is coupled to a first clock signal terminal, the output terminal of the input circuit is coupled to a first node, and the input circuit is configured to provide a signal of the signal input terminal to the first node under the control of the first clock signal terminal and the signal input terminal, respectively, the control terminal of the reset circuit is coupled to a reset signal terminal, the input terminal of the reset circuit is coupled to a reference signal terminal, a first output terminal of the reset circuit is coupled to the first node, a second output terminal of the reset circuit is coupled to a signal output terminal, and the reset circuit is configured to provide a signal of the reference signal terminal to the first node and the signal output terminal under the control of the reset signal terminal, respectively, a first control terminal of the control circuit is coupled to the first node, a first input terminal of the control circuit is coupled to the reference signal terminal, a first output terminal of the control circuit is coupled to a second node, a second control terminal of the control circuit and a second input terminal of the control circuit are coupled to the first clock signal terminal, respectively, a second output terminal of the control circuit is coupled to the second node, and the control circuit is configured to provide the signal of the reference signal terminal to the second node under the control of the first node and providing a signal of the first clock signal terminal to the second node under the control of the first clock signal terminal, a first control terminal of the output circuit is coupled to the first node, a first input terminal of the output circuit is coupled to a second clock signal terminal, a first output terminal of the output circuit is coupled to the signal output terminal, a second control terminal of the output circuit is coupled to the second node, a second input terminal of the output circuit is coupled to the reference signal terminal, a second output terminal of the output circuit is coupled to the first node, a third output terminal of the output circuit is coupled to the signal output terminal, and the output circuit is configured to provide a signal of the second clock signal terminal to the signal output terminal under the control of the first node and providing the signal of the reference signal terminal to the first node and the signal output terminal under the control of the second node, respectively, and both terminals of the pull-down circuit are coupled to the first clock signal terminal and the first node, respectively, and the pull-down circuit is configured to pull down the potential of the first node when the potential of the second clock signal terminal rises.

In a possible implementation, in the above shift register unit provided by an embodiment of the disclosure, the pull-down circuit specifically comprises a first capacitor, and both terminals of the first capacitor are coupled to the first clock signal terminal and the first node, respectively.

In a possible implementation, in the above shift register unit provided by an embodiment of the disclosure, the output terminal specifically comprises a first output circuit and a second output circuit, wherein the control terminal of the first output circuit is coupled to the first node, the input terminal of the first output circuit is coupled to the second clock signal terminal, the output terminal of the first output circuit is coupled to the signal output terminal, and the first output circuit is configured to provide the signal of the second clock signal terminal to the signal output terminal under the control of the first node, and the control terminal of the second output circuit is coupled to the second node, the input terminal of the second output circuit is coupled to the reference signal terminal, a first output terminal of the second output circuit is coupled to the first node, a second output terminal of the second output circuit is coupled to the signal output terminal, and the second output circuit is configured to provide the signal of the reference signal terminal to the first node and the signal output terminal under the control of the second node, respectively.

In a possible implementation, in the above shift register unit provided by an embodiment of the disclosure, the first output circuit specifically comprises a first switch transistor and a second capacitor, wherein the gate of the first switch transistor is coupled to the first node, the source of the first switch transistor is coupled to the second clock signal terminal, and the drain of the first switch transistor is coupled to the signal output terminal, and the second capacitor is connected between the gate and the drain of the first switch transistor.

In a possible implementation, in the above shift register unit provided by an embodiment of the disclosure, the range of ratio of the capacitance value of the first capacitor and the capacitance value of the second capacitor is 0.8 to 1.2.

In a possible implementation, in the above shift register unit provided by an embodiment of the disclosure, the second output circuit specifically comprises a second switch transistor and a third switch transistor, wherein the gate of the second switch transistor is coupled to the second node, the source of the second switch transistor is coupled to the reference signal terminal, and the drain of the second switch transistor is coupled to the first node, and the gate of the third switch transistor is coupled to the second node, the source of the third switch transistor is coupled to the reference signal terminal, and the drain of the third switch transistor is coupled to the signal output terminal.

In a possible implementation, in the above shift register unit provided by an embodiment of the disclosure, the output circuit further comprises a third output circuit, and the control terminal of the third output circuit is coupled to the first clock signal terminal, the input terminal of the third output circuit is coupled to the reference signal terminal, the output terminal of the third output circuit is coupled to the signal output terminal, and the third output circuit is configured to provide the signal of the reference signal terminal to the signal output terminal under the control of the first clock signal terminal.

In a possible implementation, in the above shift register unit provided by an embodiment of the disclosure, the third output circuit specifically comprises a fourth switch transistor, and the gate of the fourth switch transistor is coupled to the first clock signal terminal, the source of the fourth switch transistor is coupled to the reference signal terminal, and the drain of the fourth switch transistor is coupled to the signal output terminal.

In a possible implementation, in the above shift register unit provided by an embodiment of the disclosure, the input circuit specifically comprises a fifth switch transistor and a sixth switch transistor, wherein the gate and the source of the fifth switch transistor are coupled to the signal input terminal, respectively, and the drain of the fifth switch transistor is coupled to the first node, and the gate of the sixth switch transistor is coupled to the first clock signal terminal, the source of the sixth switch transistor is coupled to the signal input terminal, and the drain of the sixth switch transistor is coupled to the first node.

In a possible implementation, in the above shift register unit provided by an embodiment of the disclosure, the reset circuit specifically comprises a seventh switch transistor and an eighth switch transistor, wherein the gate of the seventh switch transistor is coupled to the reset signal terminal, the source of the seventh switch transistor is coupled to the reference signal terminal, and the drain of the seventh switch transistor is coupled to the first node, and the gate of the eighth switch transistor is coupled to the reset signal terminal, the source of the eighth switch transistor is coupled to the reference signal terminal, and the drain of the eighth switch transistor is coupled to the signal output terminal.

In a possible implementation, in the above shift register unit provided by embodiments of the disclosure, the control circuit specifically comprises a first control circuit and a second control circuit, wherein the control terminal of the first control circuit is coupled to the first node, the input terminal of the first control circuit is coupled to the reference signal terminal, the output terminal of the first control circuit is coupled to the second node, and the first control circuit is configured to provide the signal of the reference signal terminal to the second node under the control of the first node, and the control terminal and the input terminal of the second control circuit are coupled to the first clock signal terminal, respectively, the output terminal of the second control circuit is coupled to the second node, and the second control circuit is configured to provide the signal of the first clock signal terminal to the second node under the control of the first clock signal terminal.

In a possible implementation, in the above shift register unit provided by an embodiment of the disclosure, the first control circuit specifically comprises a ninth switch transistor and a tenth switch transistor, wherein the gate of the ninth switch transistor is coupled to the first node, the source of the ninth switch transistor is coupled to the reference signal terminal, and the drain of the ninth switch transistor is coupled to the second node, and the gate of the tenth switch transistor is coupled to the first node, the source of the tenth switch transistor is coupled to the reference signal terminal, and the drain of the tenth switch transistor is coupled to a third node.

In a possible implementation, in the above shift register unit provided by an embodiment of the disclosure, the second control circuit specifically comprises an eleventh switch transistor and a twelfth switch transistor, wherein the gate and the source of the eleventh switch transistor are coupled to the first clock signal terminal, respectively, and the drain of the eleventh switch transistor is coupled to the third node, and the gate of the twelfth switch transistor is coupled to the third node, the source of the twelfth switch transistor is coupled to the first clock signal terminal, and the drain of the twelfth switch transistor is coupled to the second node.

An embodiment of the disclosure further provides a gate driving circuit comprising a plurality of cascaded above shift register units provided by embodiments of the disclosure, wherein except for the shift register unit at the first stage, the signal output terminal of the shift register unit at each of the rest stages is coupled to the reset signal terminal of the shift register unit at a previous stage which is adjacent to it, respectively, except for the shift register unit at the last stage, the signal output terminal of the shift register unit at each of the rest stages is coupled to the signal input terminal of the shift register unit at a next stage which is adjacent to it, respectively, and the signal input terminal of the shift register unit at the first stage is coupled to a frame state signal terminal.

An embodiment of the disclosure further provides a display device comprising a gate driving circuit provided by the embodiment of the disclosure as described above.

An embodiment of the disclosure further provides a driving method of the shift register unit comprising: at a first phase, providing a signal of the signal input terminal to the first node under the control of the signal input terminal, and providing a signal of the second clock signal terminal to the signal output terminal under the control of the first node, and providing a signal of the first clock signal terminal to the second node under the control of the first clock signal terminal, and providing a signal of the reference signal terminal to the first node and the signal output terminal under the second node, respectively, at a second phase, providing the signal of the second clock signal terminal to the signal output terminal under the control of the first node, and providing the signal of the reference signal terminal to the second node under the control of the first node, at a third phase, providing the signal of the reference signal terminal to the first node and the signal output terminal under the control of the reset signal terminal, respectively, and providing the signal of the first clock signal terminal to the second node under the control of the first clock signal terminal, and providing the signal of the reference signal terminal to the first node and the signal output terminal under the second node, respectively, and at a fourth phase, pulling down the potential of the first node when the potential of the second clock signal terminal rises, and providing the signal of the first clock signal terminal to the second node under the control of the first clock signal terminal, and providing the signal of the reference signal terminal to the first node and the signal output terminal under the second node, respectively.

In a possible implementation, in the above driving method provided by an embodiment of the disclosure, there is further comprised: at the first phase and the third phase, providing the signal of the reference signal terminal to the signal output terminal under the control of the first clock signal terminal. In the shift register unit, the driving method thereof, the gate driving circuit and the display device provided by embodiments of the disclosure, the shift register unit comprises an input circuit, a reset circuit, a control circuit, a pull-down circuit and an output circuit, a first control terminal of the output circuit is coupled to a first node, its first input terminal is coupled to a second clock signal terminal, its first output terminal is coupled to a signal output terminal, both terminals of the pull-down circuit are coupled to a first clock signal terminal and the first node, respectively, and when the potential of the second clock signal terminal rises, it will result in that the potential of the first node will also rise, and at this point, since the potential of the first clock signal terminal is reduced, the pull-down circuit may pull down the potential of the first node via the first clock signal terminal.

BRIEF DESCRIPTION OF THE DRAWINGS

FIG. 4 is an input and output timing diagram of the shift register unit as shown in FIG. 3a.

DETAILED DESCRIPTION

Figure 1A:
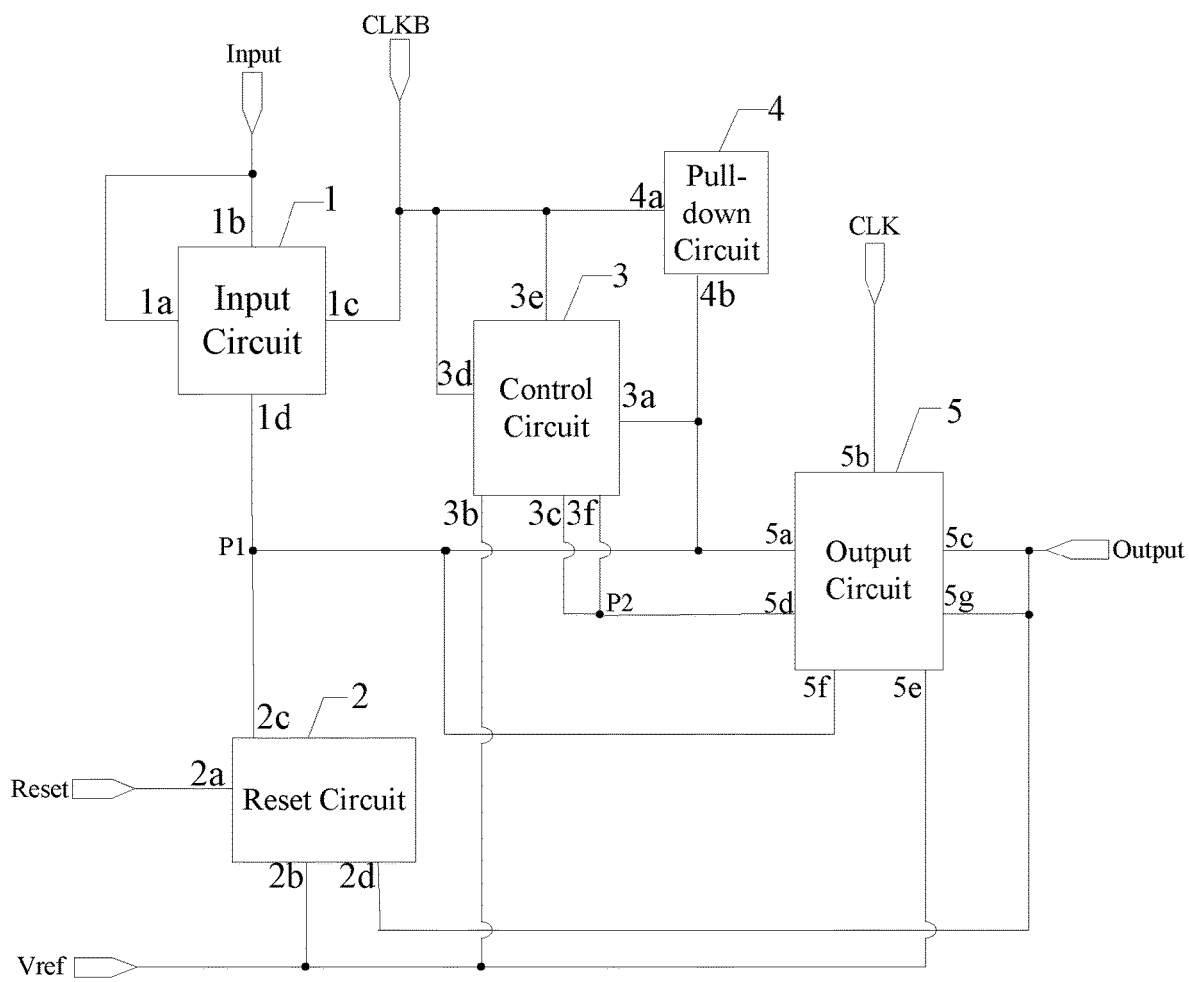
FIG. 1a is a first structural diagram of a shift register unit provided by an embodiment of the disclosure.

In the following specific implementations of a shift register unit, a driving method thereof, a gate driving circuit and a display device provided by embodiments of the disclosure will be described in detail in conjunction with the drawings.

As shown in FIG. 1a to FIG. 1d, a shift register unit provided by embodiments of the disclosure comprises: an input circuit 1, a reset circuit 2, a control circuit 3, a pull-down circuit 4 and an output circuit 5. A first control terminal 1a of the input circuit 1 and the input terminal 1b of the input circuit 1 are coupled to a signal input terminal Input, respectively, a second control terminal 1c of the input circuit 1 is coupled to a first clock signal terminal CLKB, the output terminal 1d of the input circuit 1 is coupled to a first node P1, and the input circuit 1 is configured to provide a signal of the signal input terminal Input to the first node P1 under the control of the first clock signal terminal CLKB and the signal input terminal Input, respectively.

The control terminal 2a of the reset circuit 2 is coupled to a reset signal terminal Reset, the input terminal 2b of the reset circuit 2 is coupled to a reference signal terminal Vref, a first output terminal 2c of the reset circuit 2 is coupled to the first node P1, a second output terminal 2d of the reset circuit 2 is coupled to a signal output terminal Output, and the reset circuit 2 is configured to provide a signal of the reference signal terminal Vref to the first node P1 and the signal output terminal Output under the control of the reset signal terminal Reset, respectively.

A first control terminal 3a of the control circuit 3 is coupled to the first node P1, a first input terminal 3b of the control circuit 3 is coupled to the reference signal terminal Vref, a first output terminal 3c of the control circuit 3 is coupled to a second node P2, a second control terminal 3d of the control circuit 3 and a second input terminal 3e of the control circuit 3 are coupled to the first clock signal terminal CLKB, respectively, a second output terminal 3f of the control circuit 3 is coupled to the second node P2, and the control circuit 3 is configured to provide the signal of the reference signal terminal Vref to the second node P2 under the control of the first node P1 and providing a signal of the first clock signal terminal CLKB to the second node P2 under the control of the first clock signal terminal CLKB.

A first control terminal 5a of the output circuit 5 is coupled to the first node P1, a first input terminal 5b of the output circuit 5 is coupled to a second clock signal terminal CLK, a first output terminal 5c of the output circuit 5 is coupled to the signal output terminal Output, a second control terminal 5d of the output circuit 5 is coupled to the second node P2, a second input terminal 5e of the output circuit 5 is coupled to the reference signal terminal Vref, a second output terminal 5f of the output circuit 5 is coupled to the first node P1, a third output terminal 5g of the output circuit 5 is coupled to the signal output terminal Output, and the output circuit 5 is configured to provide a signal of the second clock signal terminal CLK to the signal output terminal Output under the control of the first node P1 and providing the signal of the reference signal terminal Vref to the first node P1 and the signal output terminal Output under the control of the second node P2, respectively. One terminal 4a of the pull-down circuit 4 is coupled to the first clock signal terminal CLKB, the other terminal 4b of the pull-down circuit 4 is coupled to the first node P1, and the pull-down circuit is configured to pull down the potential of the first node P1 when the potential of the second clock signal terminal CLK rises.

In the above-mentioned shift register unit provided by the embodiment of the disclosure, the first control terminal 5a of the output circuit 5 is coupled to the first node P1, the first input terminal 5b of the output circuit 5 is coupled to the second clock signal terminal CLK, the first output terminal 5c of the output circuit 5 is coupled to the signal output terminal Output, one terminal 4a of the pull-down circuit 4 is coupled to the first clock signal terminal CLKB, the other terminal 4b of the pull-down circuit 4 is coupled to the first node P1, and when the potential of the second clock signal terminal CLK rises, it will result in that the potential of the first node P1 will also rise, and at this point, since the potential of the first clock signal terminal CLKB is reduced, the pull-down circuit 4 may pull down the potential of the first node P1 via the first clock signal terminal CLKB, so as to cause the potential of the first node P1 to be more stable.

When implemented particularly, in the above-described shift register unit provided by the embodiment of the invention, the potential of the reference signal terminal Vref is a low potential.

In the following, the invention will be described in detail in conjunction with a specific embodiment. It needs to be noted that the embodiment is used for the purpose of better explaining the invention, but not for limiting the invention.

When implemented particularly, in the above-described shift register unit provided by an embodiment of the disclosure, as shown in FIG. 2a, FIG. 2b, FIG. 3a and FIG. 3b, the pull-down circuit 4 may specifically comprise a first capacitor C1, and both terminals of the first capacitor C1 are coupled to the first clock signal terminal CLKB and the first node P1, respectively.

In particular, in the above-described shift register unit provided by the embodiment of the disclosure, when the potential of the second clock signal terminal CLK rises, it will result in that the potential of the first node P1 will also rise, and at this point, since the potential of the first clock signal terminal CLKB is reduced, the potential of the first node P1 may be pulled down via the bootstrap function of the first capacitor C1.

What is described above just exemplifies a specific structure of the pull-down circuit 4 in the shift register unit, and when implemented particularly, the specific structure of the pull-down circuit 4 is not limited to the above-mentioned structure provided by the embodiment of the disclosure, and may also be other structures known to the skilled in the art, which will not be defined herein.

Figure 1B:
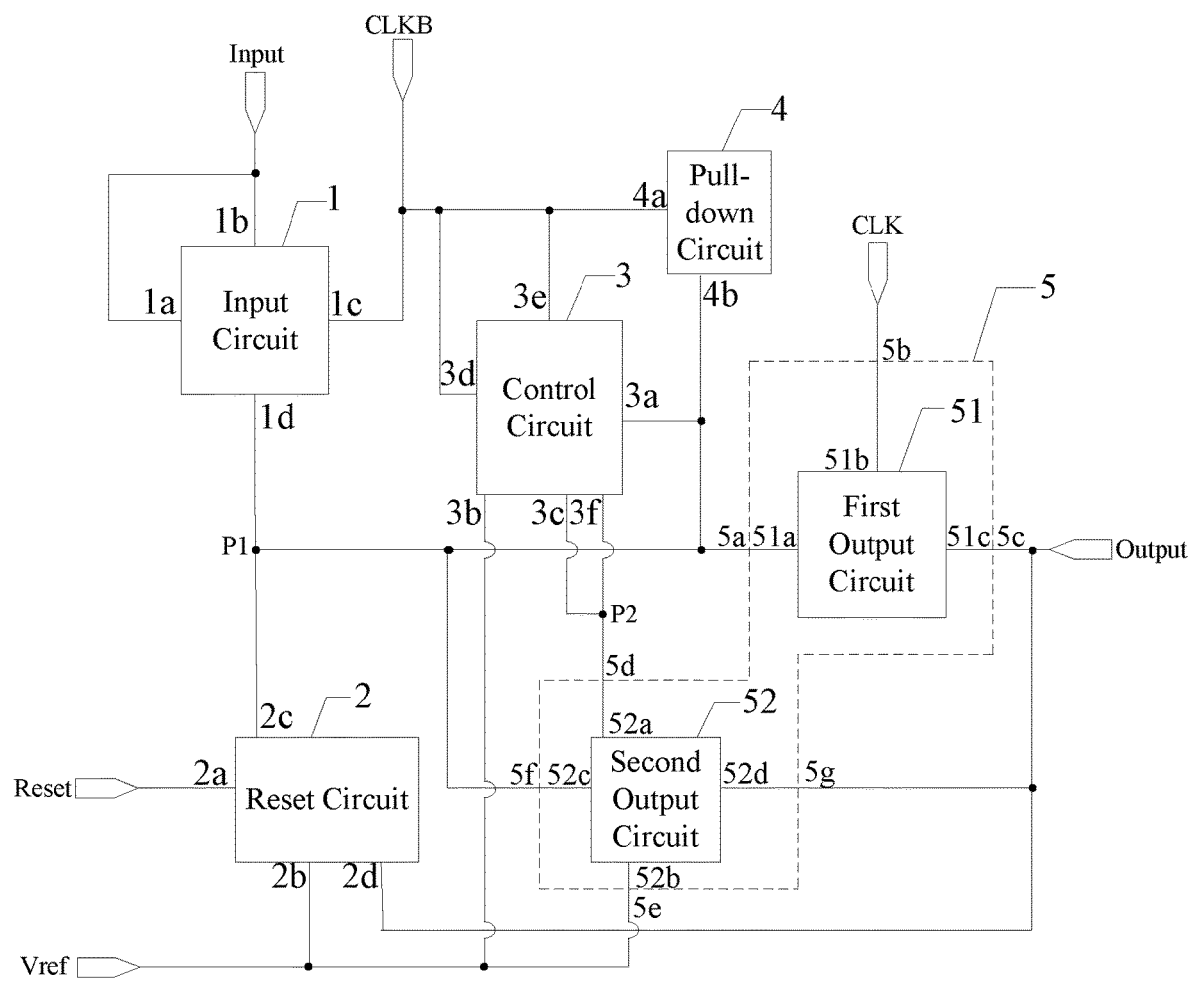
FIG. 1b is a second structural diagram of a shift register unit provided by an embodiment of the disclosure.

When implemented particularly, in the above-described shift register unit provided by an embodiment of the disclosure, as shown in FIG. 1b, the output terminal 5 may specifically comprise a first output circuit 51 and a second output circuit 52, wherein the control terminal 51a (equivalent to 5a in FIG. 1a) of the first output circuit 51 is coupled to the first node P1, the input terminal 51b (equivalent to 5b in FIG. 1a) of the first output circuit 51 is coupled to the second clock signal terminal CLK, the output terminal 51c (equivalent to 5c in FIG. 1a) of the first output circuit 51 is coupled to the signal output terminal Output, and the first output circuit is configured to provide the signal of the second clock signal terminal CLK to the signal output terminal Output under the control of the first node P1, and the control terminal 52a (equivalent to 5d in FIG. 1a) of the second output circuit 52 is coupled to the second node P2, the input terminal 52b (equivalent to 5e in FIG. 1a) of the second output circuit 52 is coupled to the reference signal terminal Vref, a first output terminal 52c (equivalent to 5f in FIG. 1a) of the second output circuit 52 is coupled to the first node P1, a second output terminal 52d (equivalent to 5g in FIG. 1a) of the second output circuit 52 is coupled to the signal output terminal Output, and the second output circuit is configured to provide the signal of the reference signal terminal Vref to the first node P1 and the signal output terminal Output under the control of the second node P2, respectively.

When implemented particularly, in the above-described shift register unit provided by an embodiment of the disclosure, as shown in FIG. 2a, FIG. 2b, FIG. 3a and FIG. 3b, the first output circuit 51 specifically comprises a first switch transistor T1 and a second capacitor C2, wherein the gate of the first switch transistor T1 is coupled to the first node P1, the source of the first switch transistor T1 is coupled to the second clock signal terminal CLK, and the drain of the first switch transistor T1 is coupled to the signal output terminal Output, and the second capacitor C2 is connected between the gate and the drain of the first switch transistor T1.

Figure 2A:
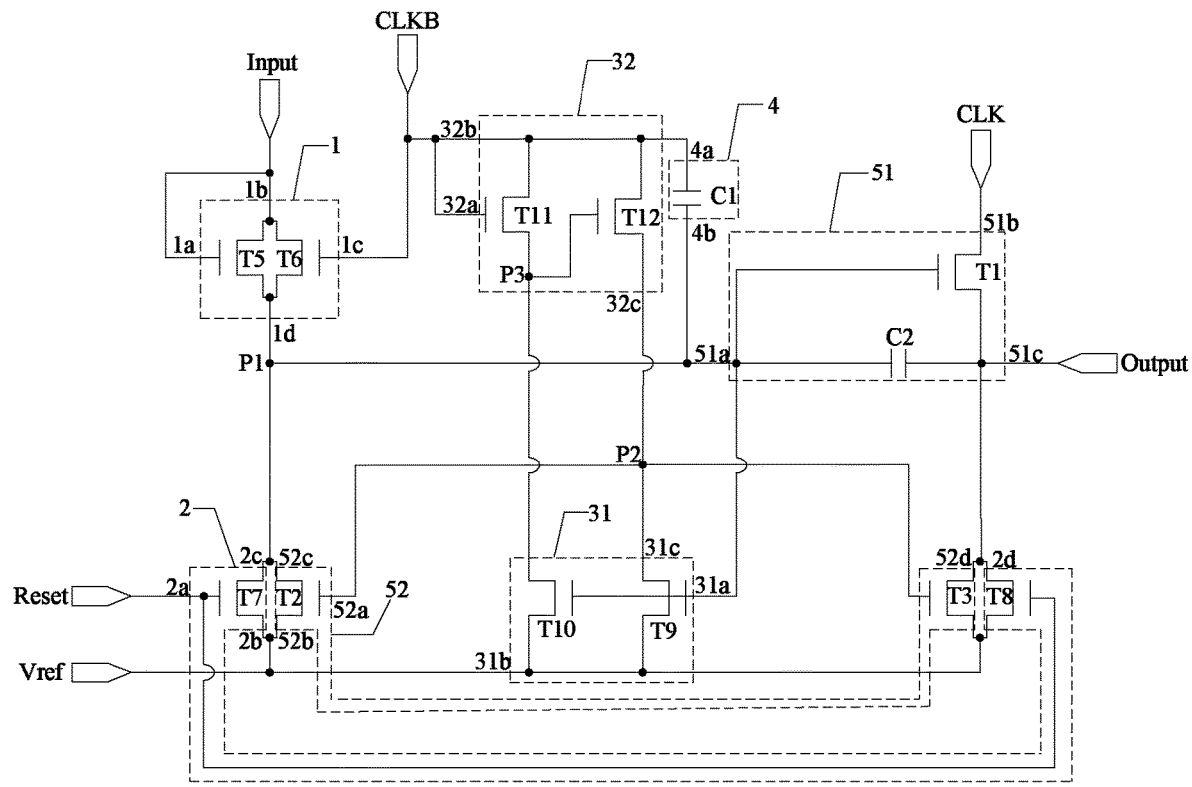
FIG. 2a is a first specific structural diagram of a shift register unit provided by an embodiment of the disclosure.
Figure 2B:
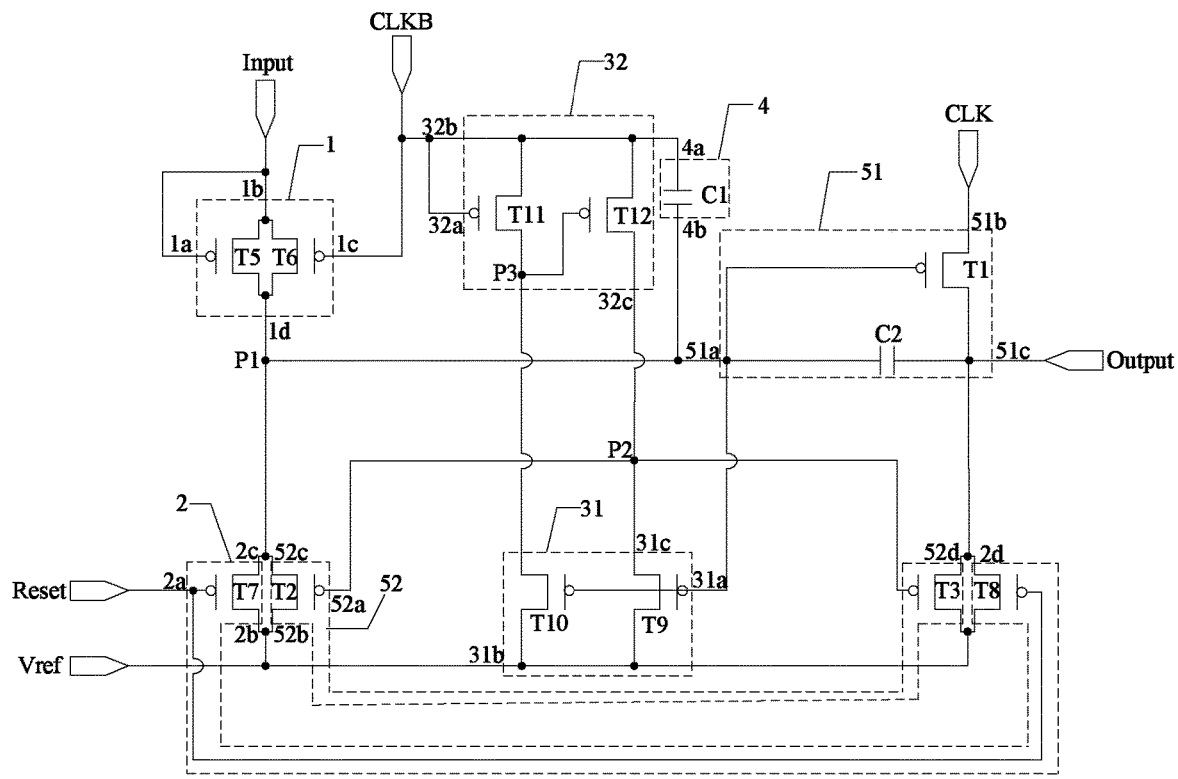
FIG. 2b is a second specific structural diagram of a shift register unit provided by an embodiment of the disclosure.
Figure 3A:
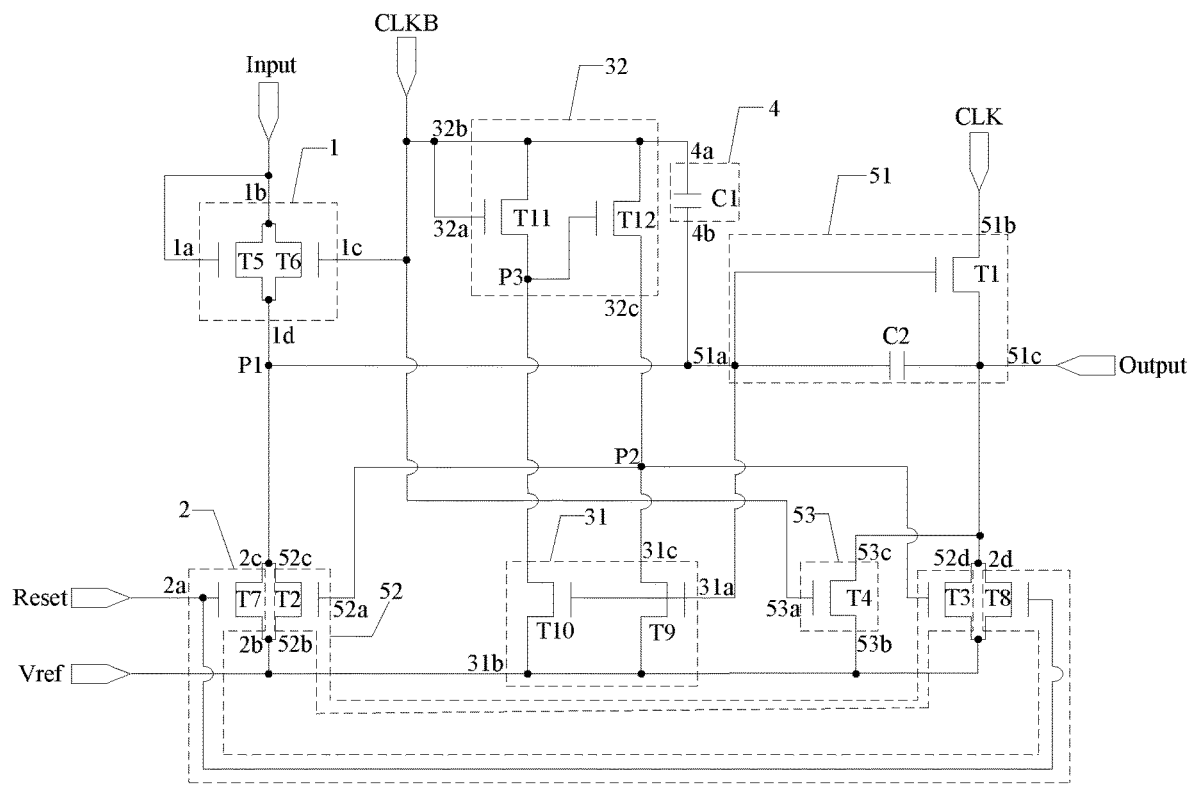
FIG. 3a is a third specific structural diagram of a shift register unit provided by an embodiment of the disclosure.
Figure 3B:
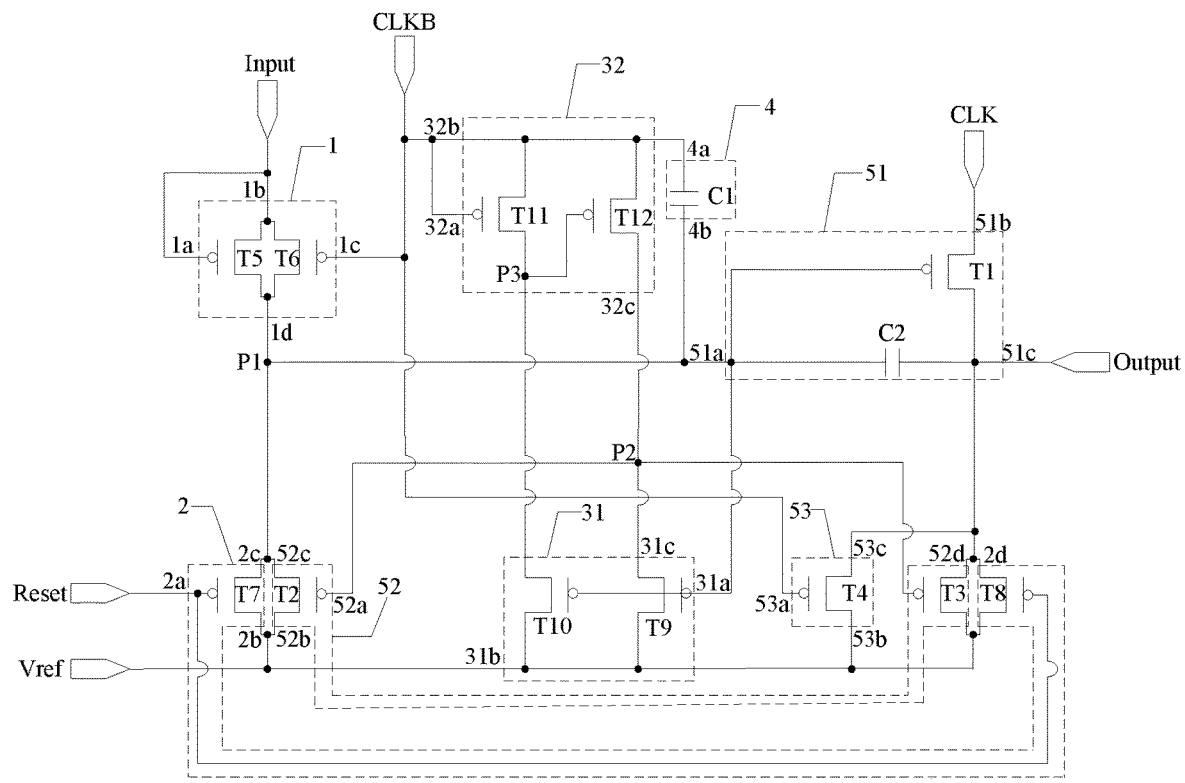
FIG. 3b is a fourth specific structural diagram of a shift register unit provided by an embodiment of the disclosure.

In particular, in the above-described shift register unit provided by an embodiment of the disclosure, as shown in FIG. 2a and FIG. 3a, the first switch transistor T1 may be an N-type transistor, and alternatively, as shown in FIG. 2b and FIG. 3b, the first switch transistor T1 may also be a P-type transistor, which will not be defined herein. Taking that the first switch transistor T1 is an N-type transistor as an example, when the potential of the first node P1 is a low potential, the first switch transistor T1 is in the cut-off state, and when the potential of the second clock signal terminal CLK is a high potential, since the current of the first switch transistor T1 is large, the size of the first switch transistor T1 is large and the parasitic capacitance of the first switch transistor T1 is large, which will result in that the potential of the first node P1 will be pulled high, and since the second clock signal terminal CLK charges the second capacitor C2, this will result in that the potential of the first node P1 will be pulled high again. At this point, since the potential of the first clock signal terminal CLKB is a low potential, the potential of the first node P1 may be pulled down via the bootstrap function of the first capacitor C1. When the potential of the first node P1 is a high potential, the first switch transistor T1 is in the conductive state, and the second clock signal terminal CLK is coupled to the signal output terminal Output, when the potential of the second clock signal terminal CLK is a high potential, the signal output terminal Output outputs a voltage signal of a high potential, and because of the bootstrap function of the second capacitor C2 and the existence of the parasitic capacitance of the first switch transistor T1, the rise of the potential of the signal output terminal Output will cause the potential of the first node P1 to rise further, which may further improve the charging capability of the first switch transistor T1 and guarantee the charging time of a pixel, and when the potential of the second clock signal terminal CLK is a low potential, the potential of the signal output terminal Output is a low potential.

What is described above just exemplifies a specific structure of the first output circuit 51 in the shift register unit, and when implemented particularly, the specific structure of the first output circuit 51 is not limited to the above-mentioned structure provided by the embodiment of the disclosure, and may also be other structures known to the skilled in the art, which will not be defined herein.

When implemented particularly, in the above-described shift register unit provided by an embodiment of the disclosure, the ratio of the capacitance value of the first capacitor and the capacitance value of the second capacitor may be controlled to be within the range of 0.8 to 1.2. In particular, the ratio of the capacitance value of the first capacitor and the capacitance value of the second capacitor may be appropriately adjusted according to the actual situation, and will not be defined herein.

When implemented particularly, in the above-described shift register unit provided by an embodiment of the disclosure, as shown in FIG. 2a, FIG. 2b, FIG. 3a and FIG. 3b, the second output circuit 52 may specifically comprise a second switch transistor T2 and a third switch transistor T3, wherein the gate of the second switch transistor T2 is coupled to the second node P2, the source of the second switch transistor T2 is coupled to the reference signal terminal Vref, and the drain of the second switch transistor T2 is coupled to the first node P1, and the gate of the third switch transistor T3 is coupled to the second node P2, the source of the third switch transistor T3 is coupled to the reference signal terminal Vref, and the drain of the third switch transistor T3 is coupled to the signal output terminal Output.

In particular, in the above-described shift register unit provided by an embodiment of the disclosure, as shown in FIG. 2a and FIG. 3a, the second switch transistor T2 and the third switch transistor T3 may be N-type transistors, and alternatively, as shown in FIG. 2b and FIG. 3b, the second switch transistor T2 and the third switch transistor T3 may also be P-type transistors, which will not be defined herein. Taking that the second switch transistor T2 and the third switch transistor T3 are N-type transistors as an example, when the potential of the second node P2 is a high potential, the second switch transistor T2 and the third switch transistor T3 are in the conductive state, the reference signal terminal Vref is coupled to the first node P1 and the signal output terminal Output, respectively, the potentials of the first node P1 and the signal output terminal Output are caused to be low potentials, and the reference signal terminal Vref performs noise reduction on the first node P1 and the signal output terminal Output, respectively, which may thus reduce the noise of the signal outputted by the signal output terminal Output of the shift register unit, and guarantee the stability of the signal outputted by the signal output terminal Output.

What is described above just exemplifies a specific structure of the second output circuit 52 in the shift register unit, and when implemented particularly, the specific structure of the second output circuit 52 is not limited to the above-mentioned structure provided by the embodiment of the disclosure, and may also be other structures known to the skilled in the art, which will not be defined herein.

Figure 1C:
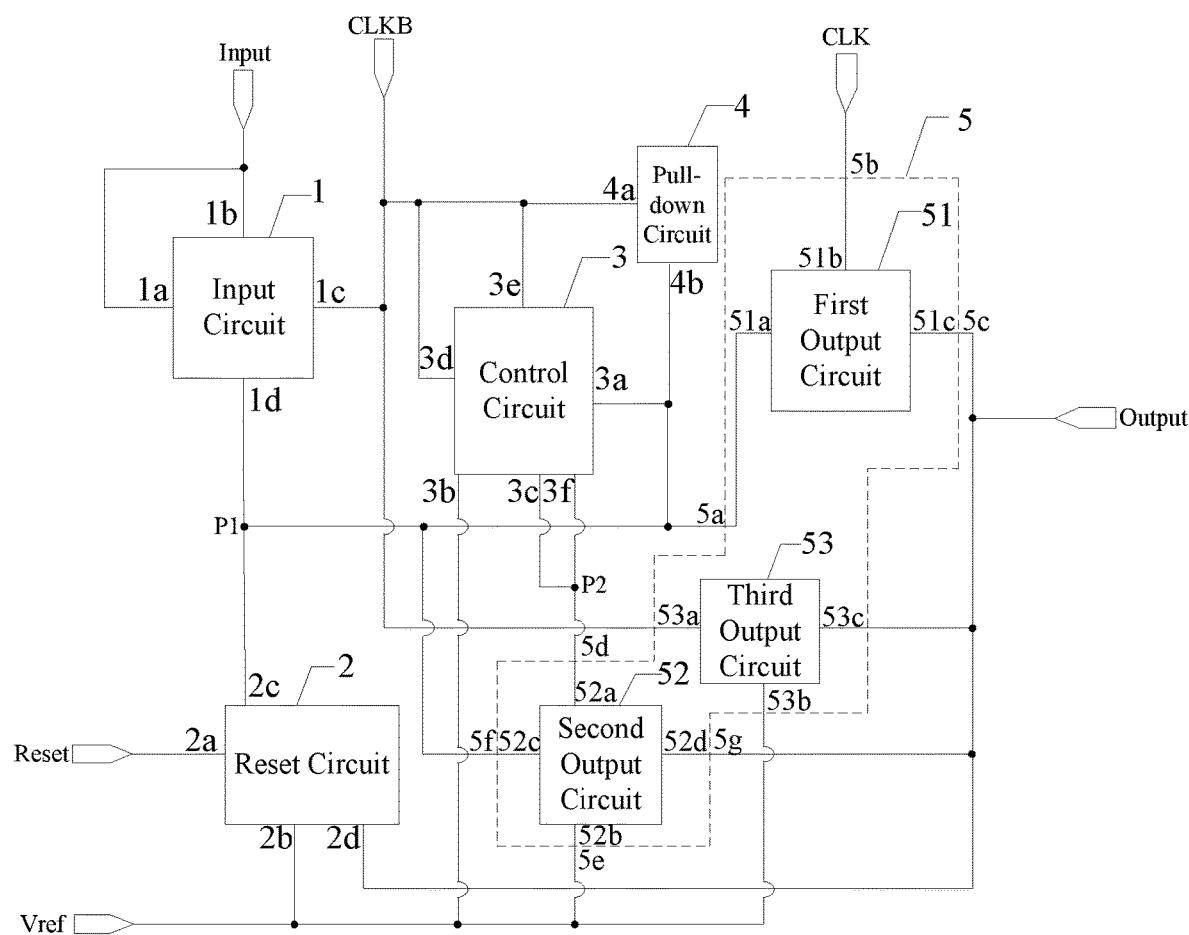
FIG. 1c is a third structural diagram of a shift register unit provided by an embodiment of the disclosure.

Alternatively or additionally, in the above-described shift register unit provided by an embodiment of the disclosure, as shown in FIG. 1c, the output circuit 5 may further comprise a third output circuit 53, and the control terminal 53a of the third output circuit 53 is coupled to the first clock signal terminal CLKB, the input terminal 53b (also equivalent to 5e in FIG. 1a) of the third output circuit 53 is coupled to the reference signal terminal Vref, the output terminal 53c of the third output circuit 53 is coupled to the signal output terminal Output, and the third output circuit is configured to provide the signal of the reference signal terminal Vref to the signal output terminal Output under the control of the first clock signal terminal CLKB. As such, the third output circuit 53 may pull down the potential of the signal output terminal Output under the control of the first clock signal terminal CLKB, and thereby may further reduce the noise of the signal outputted by the signal output terminal Output and guarantee the stability of the signal outputted by the signal output terminal Output.

When implemented particularly, in the above-described shift register unit provided by an embodiment of the disclosure, as shown in FIG. 3a and FIG. 3b, the third output circuit 53 may specifically comprise a fourth switch transistor T4, and the gate of the fourth switch transistor T4 is coupled to the first clock signal terminal CLKB, the source of the fourth switch transistor T4 is coupled to the reference signal terminal Vref, and the drain of the fourth switch transistor T4 is coupled to the signal output terminal Output.

In particular, in the above-described shift register unit provided by an embodiment of the disclosure, as shown in FIG. 3a, the fourth switch transistor T4 may be an N-type transistor, and alternatively, as shown in FIG. 3b, the fourth switch transistor T4 may also be a P-type transistor, which will not be defined herein. Taking that the fourth switch transistor T4 is an N-type transistor as an example, when the potential of the first clock signal terminal CLKB is a high potential, the fourth switch transistor T4 is in the conductive state, the reference signal terminal Vref is coupled to the signal output terminal Output, the potential of the signal output terminal Output is caused to be a low potential, and the reference signal terminal Vref performs noise reduction on the signal output terminal Output, which may thus reduce the noise of the signal outputted by the signal output terminal Output of the shift register unit and guarantee the stability of the signal outputted by the signal output terminal Output.

What is described above just exemplifies a specific structure of the third output circuit 53 in the shift register unit, and when implemented particularly, the specific structure of the third output circuit 53 is not limited to the above-mentioned structure provided by the embodiment of the disclosure, and may also be other structures known to the skilled in the art, which will not be defined herein.

When implemented particularly, in the above-described shift register unit provided by an embodiment of the disclosure, as shown in FIG. 2a, FIG. 2b, FIG. 3a and FIG. 3b, the input circuit 1 may specifically comprise a fifth switch transistor T5 and a sixth switch transistor T6, wherein the gate and the source of the fifth switch transistor T5 are coupled to the signal input terminal Input, respectively, and the drain of the fifth switch transistor T5 is coupled to the first node P1, and the gate of the sixth switch transistor T6 is coupled to the first clock signal terminal CLKB, the source of the sixth switch transistor T6 is coupled to the signal input terminal Input, and the drain of the sixth switch transistor T6 is coupled to the first node P1.

In particular, in the above-described shift register unit provided by an embodiment of the disclosure, as shown in FIG. 2a and FIG. 3a, the fifth switch transistor T5 and the sixth switch transistor T6 may be N-type transistors, and alternatively, as shown in FIG. 2b and FIG. 3b, the fifth switch transistor T5 and the sixth switch transistor T6 may also be P-type transistors, which will not be defined herein. Taking that the fifth switch transistor T5 and the sixth switch transistor T6 are N-type transistors as an example, when the potential of the signal input terminal Input is a high potential, the fifth switch transistor T5 is in the conductive state, the signal input terminal Input is coupled to the first node P1, the potentials of the first node P1 is caused to be a high potential, when the potential of the first clock signal terminal CLKB is a high potential, the sixth switch transistor T6 is in the conductive state, the signal input terminal Input is coupled to the first node P1, and when the potential of the signal input terminal Input is a low potential, the potential of the first node P1 is caused to be a low potential, and when the potential of the signal input terminal Input is a high potential, the potential of the first node P1 is caused to be a high potential.

What is described above just exemplifies a specific structure of the input circuit 1 in the shift register unit, and when implemented particularly, the specific structure of the input circuit 1 is not limited to the above-mentioned structure provided by the embodiment of the disclosure, and may also be other structures known to the skilled in the art, which will not be defined herein.

When implemented particularly, in the above-described shift register unit provided by an embodiment of the disclosure, as shown in FIG. 2a, FIG. 2b, FIG. 3a and FIG. 3b, the reset circuit 2 may specifically comprise a seventh switch transistor T7 and an eighth switch transistor T8, wherein the gate of the seventh switch transistor T7 is coupled to the reset signal terminal Reset, the source of the seventh switch transistor T7 is coupled to the reference signal terminal Vref, and the drain of the seventh switch transistor T7 is coupled to the first node P1, and the gate of the eighth switch transistor T8 is coupled to the reset signal terminal Reset, the source of the eighth switch transistor T8 is coupled to the reference signal terminal Vref, and the drain of the eighth switch transistor T8 is coupled to the signal output terminal Output.

In particular, in the above-described shift register unit provided by an embodiment of the disclosure, as shown in FIG. 2a and FIG. 3a, the seventh switch transistor T7 and the eighth switch transistor T8 may be N-type transistors, and alternatively, as shown in FIG. 2b and FIG. 3b, the seventh switch transistor T7 and the eighth switch transistor T8 may also be P-type transistors, which will not be defined herein. Taking that the seventh switch transistor T7 and the eighth switch transistor T8 are N-type transistors as an example, when the potential of the reset signal terminal Reset is a high potential, the seventh switch transistor T7 and the eighth switch transistor T8 are in the conductive state, the reference signal terminal Vref is coupled to the first node P1 and the signal output terminal Output, respectively, the potentials of the first node P1 and the signal output terminal Output are caused to be low potentials, and the reference signal terminal Vref performs noise reduction on the first node P1 and the signal output terminal Output, respectively, which may thus reduce the noise of the signal outputted by the signal output terminal Output of the shift register unit, and guarantee the stability of the signal outputted by the signal output terminal Output.

What is described above just exemplifies a specific structure of the reset circuit 2 in the shift register unit, and when implemented particularly, the specific structure of the reset circuit 2 is not limited to the above-mentioned structure provided by the embodiment of the disclosure, and may also be other structures known to the skilled in the art, which will not be defined herein.

Figure 1D:
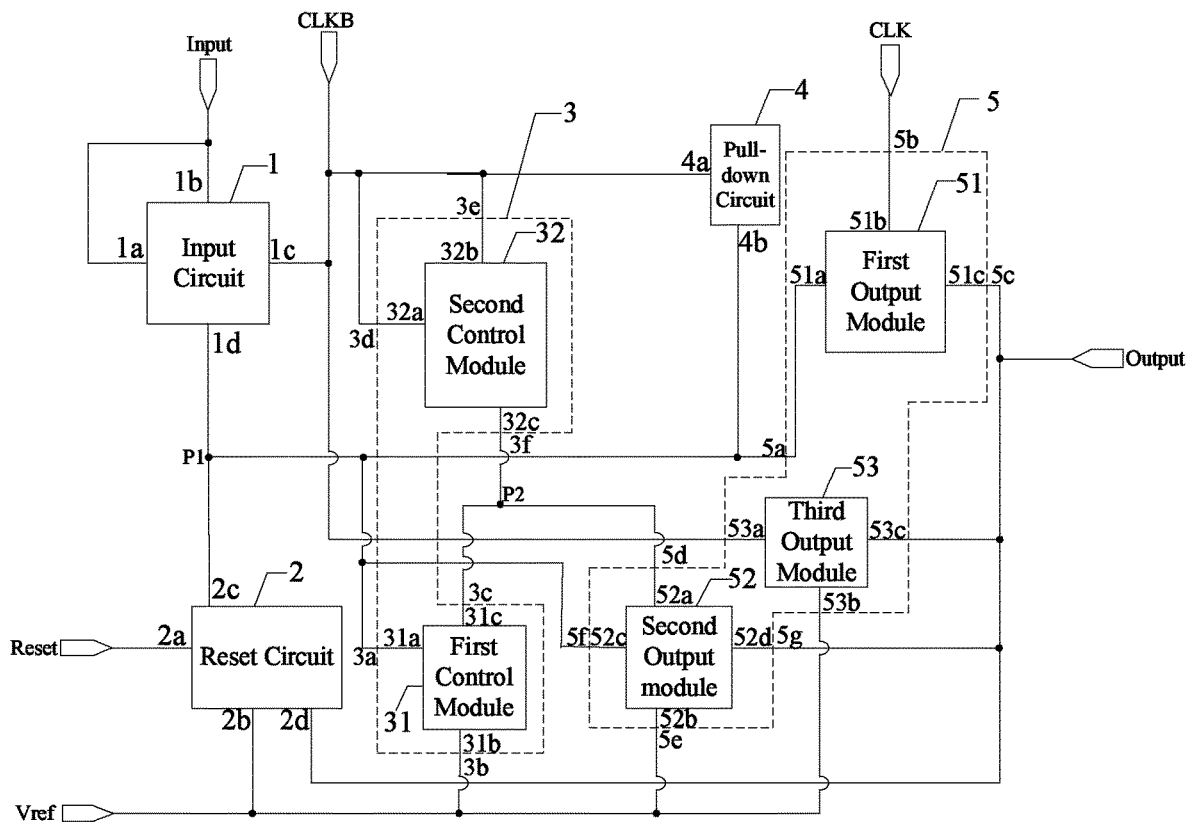
FIG. 1d is a fourth structural diagram of a shift register unit provided by an embodiment of the disclosure.

When implemented particularly, in the above-described shift register unit provided by an embodiment of the disclosure, as shown in FIG. 1d, the control circuit 3 may specifically comprise a first control circuit 31 and a second control circuit 32, wherein the control terminal 31a (equivalent to 3a in FIG. 1a) of the first control circuit 31 is coupled to the first node P1, the input terminal 31b (equivalent to 3b in FIG. 1a) of the first control circuit 31 is coupled to the reference signal terminal Vref, the output terminal 31c (equivalent to 3c in FIG. 1a) of the first control circuit 31 is coupled to the second node P2, and the first control circuit is configured to provide the signal of the reference signal terminal Vref to the second node P2 under the control of the first node P1, and the control terminal 32a (equivalent to 3d in FIG. 1a) of the second control circuit 32 and the input terminal 32b (equivalent to 3e in FIG. 1a) of the second control circuit 32 are coupled to the first clock signal terminal CLKB, respectively, the output terminal 32c (equivalent to 3f in FIG. 1a) of the second control circuit 32 is coupled to the second node P2, and the second control circuit is configured to provide the signal of the first clock signal terminal CLKB to the second node P2 under the control of the first clock signal terminal CLKB.

When implemented particularly, in the above-described shift register unit provided by an embodiment of the disclosure, as shown in FIG. 2a, FIG. 2b, FIG. 3a and FIG. 3b, the first control circuit 31 may specifically comprise a ninth switch transistor T9 and a tenth switch transistor T10, wherein the gate of the ninth switch transistor T9 is coupled to the first node P1, the source of the ninth switch transistor T9 is coupled to the reference signal terminal Vref, and the drain of the ninth switch transistor T9 is coupled to the second node P2, and the gate of the tenth switch transistor T10 is coupled to the first node P1, the source of the tenth switch transistor T10 is coupled to the reference signal terminal Vref, and the drain of the tenth switch transistor T10 is coupled to a third node P3.

In particular, in the above-described shift register unit provided by an embodiment of the disclosure, as shown in FIG. 2a and FIG. 3a, the ninth switch transistor T9 and the tenth switch transistor T10 may be N-type transistors, and alternatively, as shown in FIG. 2b and FIG. 3b, the ninth switch transistor T9 and the tenth switch transistor T10 may also be P-type transistors, which will not be defined herein. Taking that the ninth switch transistor T9 and the tenth switch transistor T10 are N-type transistors as an example, when the potential of the first node P1 is a high potential, the ninth switch transistor T9 and the tenth switch transistor T10 are in the conductive state, the reference signal terminal Vref is coupled to the second node P2, the potential of the second node P2 is caused to be a low potential, and the reference signal terminal Vref performs noise reduction on the second node P2.

What is described above just exemplifies a specific structure of the first control circuit 31 in the shift register unit, and when implemented particularly, the specific structure of the first control circuit 31 is not limited to the above-mentioned structure provided by the embodiment of the disclosure, and may also be other structures known to the skilled in the art, which will not be defined herein.

When implemented particularly, in the above-described shift register unit provided by an embodiment of the disclosure, as shown in FIG. 2a, FIG. 2b, FIG. 3a and FIG. 3b, the second control circuit 32 may specifically comprise an eleventh switch transistor T11 and a twelfth switch transistor T12, wherein the gate and the source of the eleventh switch transistor T11 are coupled to the first clock signal terminal CLKB, respectively, and the drain of the eleventh switch transistor T11 is coupled to the third node P3, and the gate of the twelfth switch transistor T12 is coupled to the third node P3, the source of the twelfth switch transistor T12 is coupled to the first clock signal terminal CLKB, and the drain of the twelfth switch transistor T12 is coupled to the second node P2.

In particular, in the above-described shift register unit provided by an embodiment of the disclosure, as shown in FIG. 2a and FIG. 3a, the eleventh switch transistor T11 and the twelfth switch transistor T12 may be N-type transistors, and alternatively, as shown in FIG. 2b and FIG. 3b, the eleventh switch transistor T11 and the twelfth switch transistor T12 may also be P-type transistors, which will not be defined herein. Taking that the eleventh switch transistor T11 and the twelfth switch transistor T12 are N-type transistors as an example, when the potential of the first clock signal terminal CLKB, the eleventh switch transistor T11 is in the conductive state, the first clock signal terminal CLKB is coupled to the third node P3, the potential of the third node P3 is caused to be a high potential, and at this point, the twelfth switch transistor T12 is in the conductive state, the first clock signal terminal CLKB is coupled to the second node P2, and the potential of the second node P2 is caused to be a high potential.

What is described above just exemplifies a specific structure of the second control circuit 32 in the shift register unit, and when implemented particularly, the specific structure of the second control circuit 32 is not limited to the above-mentioned structure provided by the embodiment of the disclosure, and may also be other structures known to the skilled in the art, which will not be defined herein.

When implemented particularly, when the effective pulse signals inputted by the signal input terminal Input, the first clock signal terminal CLKB and the reset signal terminal Reset are high potential signals, the first switch transistor T1 to the twelfth switch transistor T12 may all adopt N-type transistors, and when the effective pulse signals inputted by the signal input terminal Input, the first clock signal terminal CLKB and the reset signal terminal Reset are low potential signals, the first switch transistor T1 to the twelfth switch transistor T12 may all adopt P-type transistors, which will not be defined herein.

It needs to be noted that, the switch transistors mentioned in the above embodiments of the disclosure may be thin film transistors (TFTs), and alternatively also may be metal oxide semiconductor (MOS for short) field effect transistors, which will not be defined herein. When implemented particularly, the functions of the sources and drains of these switch transistors may be interchangeable depending on the types of the transistors and the inputted signals, which will not be differentiated specifically.

With respect to the shift register unit provided by the embodiments of the disclosure, an embodiment of the disclosure further provides a driving method of the shift register unit, which comprises the following steps.

At a first phase, providing a signal of the signal input terminal to the first node under the control of the signal input terminal, and providing a signal of the second clock signal terminal to the signal output terminal under the control of the first node, and providing a signal of the first clock signal terminal to the second node under the control of the first clock signal terminal, and providing a signal of the reference signal terminal to the first node and the signal output terminal under the second node, respectively.

At a second phase, providing the signal of the second clock signal terminal to the signal output terminal under the control of the first node, and providing the signal of the reference signal terminal to the second node under the control of the first node.

At a third phase, providing the signal of the reference signal terminal to the first node and the signal output terminal under the control of the reset signal terminal, respectively, and providing the signal of the first clock signal terminal to the second node under the control of the first clock signal terminal, and providing the signal of the reference signal terminal to the first node and the signal output terminal under the second node, respectively.

At a fourth phase, pulling down the potential of the first node when the potential of the second clock signal terminal rises, and providing the signal of the first clock signal terminal to the second node under the control of the first clock signal terminal, and providing the signal of the reference signal terminal to the first node and the signal output terminal under the second node, respectively.

In the above-described driving method provided by the embodiment of the disclosure, the signal of the first clock signal terminal is provided to the second node under the control of the first clock signal terminal, and the signal of the reference signal terminal is provided to the first node and the signal output terminal under the control of the second node, respectively, which may pull down the potentials of the first node and the signal output terminal, the signal of the reference signal terminal is provided to the first node and the signal output terminal under the control of the reset signal terminal, respectively, which may pull down the potentials of the first node and the signal output terminal, as such, the noise of the signal outputted by the signal output terminal of the shift register unit may be reduced, and the stability of the signal outputted by the signal output terminal may be guaranteed, moreover, when the potential of the second clock signal terminal rises, it will result in that the potential of the first node will also rise, and at this point, since the potential of the first clock signal terminal is reduced, the potential of the first node may be pulled down via the first clock signal terminal.

Alternatively or additionally, in the above-described driving method provided by an embodiment of the disclosure, there is further provided the following steps.

At the first phase and the third phase, providing the signal of the reference signal terminal to the signal output terminal under the control of the first clock signal terminal. As such, the potential of the signal output terminal may be pulled down under the control of the first clock signal terminal, thereby the noise of the signal outputted by the signal output terminal may be reduced further, and the stability of the signal outputted by the signal output terminal may be guaranteed.

Figure 4:
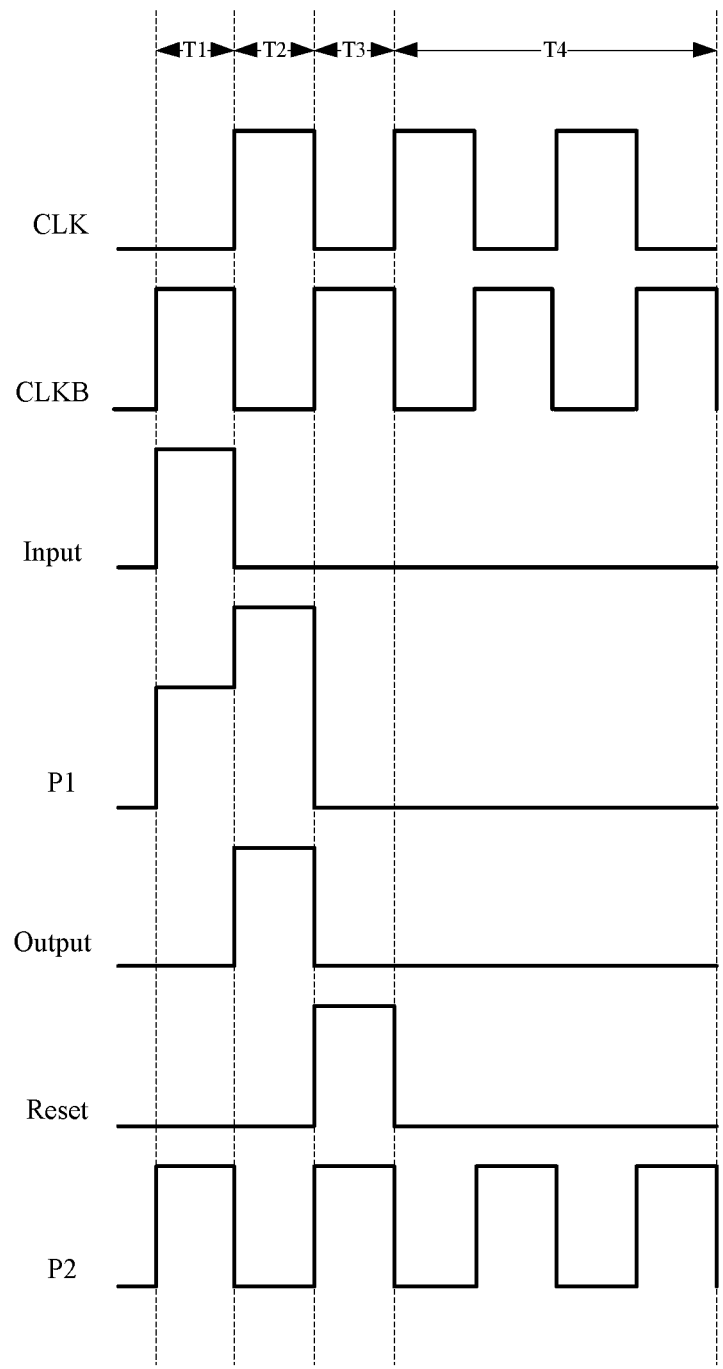

In the following, taking that the first switch transistor T1 to the twelfth switch transistor T12 are all N-type transistors as an example, the working procedure of the above-described shift register unit provided by the embodiments of the disclosure will be described. For example, in the shift register unit as shown in FIG. 3a, the first switch transistor T1 to the twelfth switch transistor T12 are all N-type transistors, the individual N-type transistors are conductive under the action of a high potential and cut off under the action of a low potential, and the effective pulse signals of the signal input terminal Input, the first clock signal terminal CLKB and the reset signal terminal Reset are high potential signals, and the signal of the reference signal terminal Vref is a low potential signal. The input and output timing diagram corresponding to FIG. 3a is as shown in FIG. 4. In particular, four phases t1~t4 in the input and output timing diagram as shown in FIG. 4 are chosen. In the following description, "1" represents a high potential, and "0" represents a low potential.

At the first phase t1, Input=1, Reset=0, CLK=0, CLKB=1, since the potential of the reset signal terminal Reset is a low potential, the seventh switch transistor T7 and the eighth switch transistor T8 are cut off, since the potential of the signal input terminal Input is a high potential, the fifth switch transistor T5 is conductive, the signal input terminal Input is coupled to the first node P1, the potential of the first node P1 is caused to be a high potential, and at this point, the second capacitor C2 is charged, the first switch transistor T1 is conductive, the second clock signal terminal CLK is coupled to the signal output terminal Output, and since the potential of the second clock signal terminal CLK is a low potential, the potential of the signal output terminal Output is caused to be still a low potential, since the potential of the first clock signal terminal CLKB is a high potential, the fourth switch transistor T4 is conductive, the reference signal terminal Vref is coupled to the signal output terminal Output, the potential of the signal output terminal Output is caused to be a low potential, and the reference signal terminal Vref performs noise reduction on the signal output terminal Output, and since the potential of the first clock signal terminal CLKB is a high potential, the eleventh switch transistor T11 is conductive, the first clock signal terminal CLKB is coupled to the third node P3, the potential of the third node P3 is caused to be a high potential, the twelfth switch transistor T12 is conductive, the first clock signal terminal CLKB is coupled to the second node P2, the potential of the second node P2 is caused to be a high potential, and at this point, the second switch transistor T2 and the third switch transistor T3 are conductive, the reference signal terminal Vref is coupled to the first node P1 and the signal output terminal Output, respectively, the potentials of the first node P1 and the signal output terminal Output are caused to be low potentials, and the reference signal terminal Vref performs noise reduction on the first node P1 and the signal output terminal Output, respectively.

At the second phase t2, Input=0, Reset=0, CLK=1, CLKB=0, since the potential of the signal input terminal Input is a low potential, the fifth switch transistor T5 is cut off, since the potential of the reset signal terminal Reset is a low potential, the seventh switch transistor T7 and the eighth switch transistor T8 are cut off, since the potential of the first clock signal terminal CLKB is a low potential, the fourth switch transistor T4, the sixth switch transistor T6, the eleventh switch transistor T11 and the twelfth switch transistor T12 are cut off, due to the action of the second capacitor C2, the first node P1 still keeps a high potential, and since the potential of the second clock signal terminal CLK is a high potential, the potential of the signal output terminal Output is caused to be a high potential, because of the bootstrap function of the second capacitor C2 and the existence of the parasitic capacitance of the first switch transistor T1, the rise of the potential of the signal output terminal Output will cause the potential of the first node P1 to rise further, which may further improve the charging capability of the first switch transistor T1 and guarantee the charging time of a pixel, and since the potential of the third node P1 is a high potential, the ninth switch transistor T9 and the tenth switch transistor T10 are conductive, the reference signal terminal Vref is coupled to the second node P2, the potential of the second node P2 is caused to be a low potential, and the reference signal terminal Vref performs noise reduction on the second node P2.

At the third phase t3, Input=0, Reset=1, CLK=0, CLKB=1, since the potential of the signal input terminal Input is a low potential, the fifth switch transistor T5 is cut off, since the potential of the reset signal terminal Reset is a high potential, the seventh switch transistor T7 and the eighth switch transistor T8 are conductive, the reference signal terminal Vref is coupled to the first node P1 and the signal output terminal Output, respectively, such that the potentials of the first node P1 and the signal output terminal Output are low potentials, and the reference signal terminal Vref performs noise reduction on the first node P1 and the signal output terminal Output, respectively, since the potential of the first clock signal terminal CLKB is a high potential, the eleventh switch transistor T11 is conductive, the first clock signal terminal CLKB is coupled to the third node P3, the potential of the third node P3 is caused to be a high potential, and at this point, the twelfth switch transistor T12 is conductive, the first clock signal terminal CLKB is coupled to the second node P2, the potential of the second node P2 is caused to be a high potential, and at this point, the second switch transistor T2 and the third switch transistor T3 are conductive, the reference signal terminal Vref is coupled to the first node P1 and the signal output terminal Output, respectively, the potentials of the first node P1 and the signal output terminal Output are caused to be low potentials, and the reference signal terminal Vref performs noise reduction on the first node P1 and the signal output terminal Output, respectively, since the potential of the first clock signal terminal CLKB is a high potential, the fourth switch transistor T4 is conductive, the reference signal terminal Vref is coupled to the signal output terminal Output, the potential of the signal output terminal Output is caused to be a low potential, and the reference signal terminal Vref performs noise reduction on the signal output terminal Output.

At the fourth phase t4, Input=0, Reset=0, and CLK=1, CLKB=0 and CLK=0, CLKB=1 keep changing alternately, and when CLK=1, CLKB=0, since the potential of the first clock signal terminal CLKB is a low potential, the potential of the second node P2 is a low potential, the second switch transistor T2 is in the cut-off state, the first node P1 has no discharge path, and at this point, the potential of the second clock signal terminal CLK is a high potential, which will cause the potential of the first node P1 to be pulled high since the parasitic capacitance between the gate and the source of the first switch transistor T1, and moreover, since the second clock signal terminal CLK charges the second capacitor C2, this will result in that the potential of the first node P1 will be pulled high again, and at this point, since the potential of the first clock signal terminal CLKB is a low potential, the potential of the first node P1 may be pulled down via the bootstrap function of the first capacitor C1, when CLK=0, CLKB=1, since the potential of the first clock signal terminal CLKB is a high potential, the potential of the second node P2 is a high potential, the second switch transistor T2 is conductive, the reference signal terminal Vref is coupled to the first node P1, the potential of the first node P1 is caused to be a low potential, the reference signal terminal Vref performs noise reduction on the first node P1, which causes the potential of the first node P1 to keep stable.

In a subsequent period of time, the signal output terminal Output will always output a voltage signal of a low potential, until the next frame arrives.

The above has been illustrated taking that the first switch transistor T1 to the twelfth switch transistor T12 are all N-type transistors as an example. In particular, the working principles for that the first switch transistor T1 to the twelfth switch transistor T12 are all P-type transistors are similar to those for that the first switch transistor T1 to the twelfth switch transistor T12 are all N-type transistors, and will not be repeated herein any more.

Figure 5:
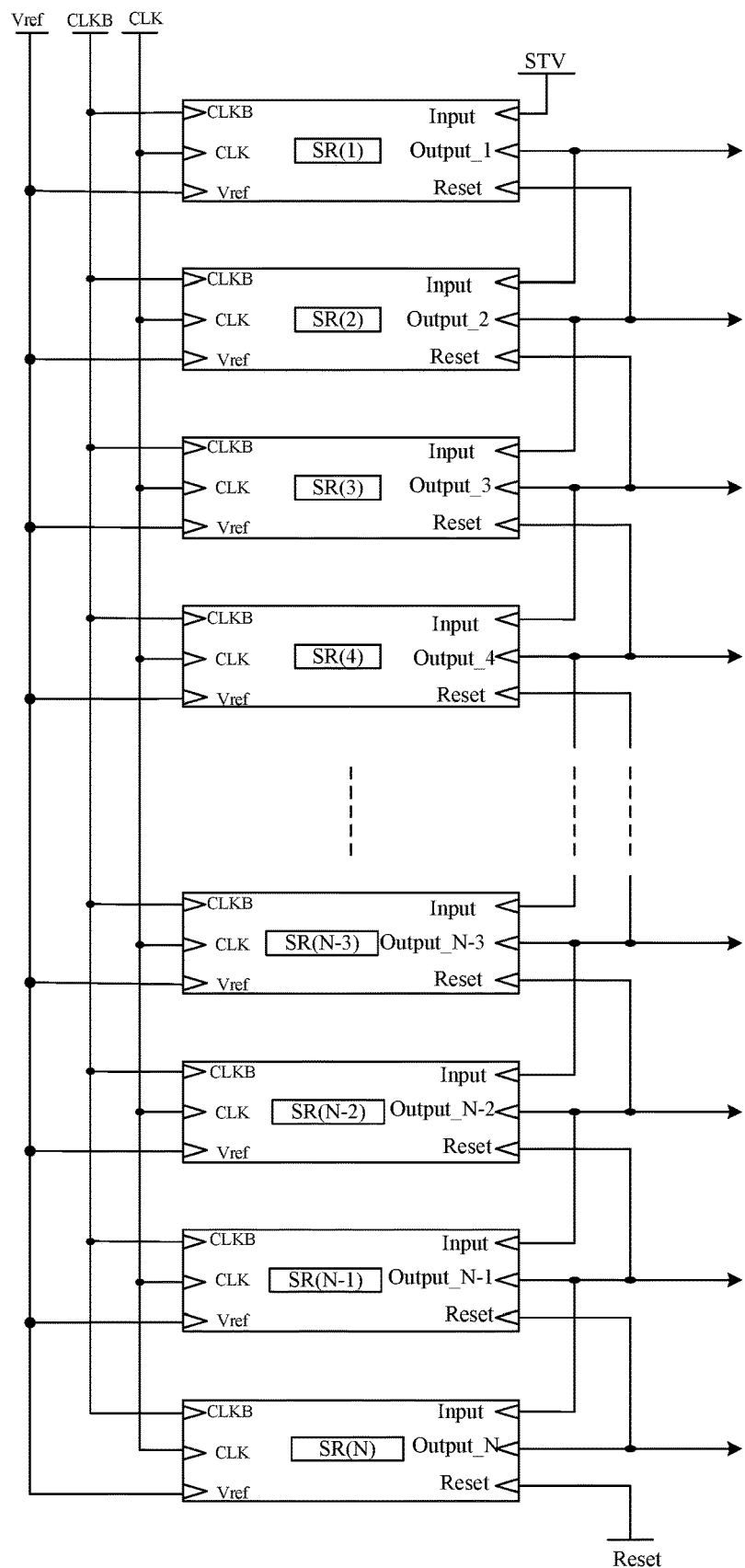
FIG. 5 is a structural diagram of a gate driving circuit provided by an embodiment of the disclosure.

Based on one and the same inventive concept, as shown in FIG. 5, an embodiment of the disclosure further provides a gate driving circuit comprising a plurality of cascaded above shift register units SR(1), SR(2) . . . SR(n) . . . SR(N−1), SR(N) (totally N shift register units, 1≤n≤N) provided by embodiments of the disclosure, wherein except for the shift register unit SR(1) at the first stage, the signal output terminal Output_n (1≤n≤N) of the shift register unit SR(n) at each of the rest stages is coupled to the reset signal terminal Reset of the shift register unit SR(n−1) at a previous stage which is adjacent to it, respectively, except for the shift register unit SR(N) at the last stage, the signal output terminal Output_n (1≤n≤N) of the shift register unit SR(n) at each of the rest stages is coupled to the signal input terminal of the shift register unit SR(n+1) at a next stage which is adjacent to it, respectively, and the signal input terminal Input of the shift register unit SR(1) at the first stage is coupled to a frame state signal terminal STV.

In particular, each of the shift register units in the above-described gate driving circuit provided by the embodiment of the disclosure is identical to that provided by embodiments of the disclosure functionally and structurally, and the repetition points will not be repeated any more.

Based on one and the same inventive concept, an embodiment of the disclosure further provides a display device comprising a gate driving circuit provided by the embodiment of the disclosure as described above. The display device may be any product or component that has the display function, such as a mobile phone, a tablet, a television, a display, a notebook, a digital photo frame, a navigator, etc. The implementation of the display device may refer to the embodiment of the above-described gate driving circuit, and the repetition points will not be repeated any more.

Embodiments of the disclosure provide a shift register unit, a driving method thereof, a gate driving circuit and a display device. The shift register unit comprises an input circuit, a reset circuit, a control circuit, a pull-down circuit and an output circuit, a first control terminal of the output circuit is coupled to a first node, its first input terminal is coupled to a second clock signal terminal, its first output terminal is coupled to a signal output terminal, both terminals of the pull-down circuit are coupled to a first clock signal terminal and the first node, respectively, and when the potential of the second clock signal terminal rises, it will result in that the potential of the first node will also rise, and at this point, since the potential of the first clock signal terminal is reduced, the pull-down circuit may pull down the potential of the first node via the first clock signal terminal.

Clearly, various changes and variations to the invention may be made by the skilled in the art without departing from the spirit and scope of the invention. Thus, if these modifications and variations to the invention pertain to the scope of the claims and their equivalents of the invention, the invention is also intended to encompass these changes and variations.

The invention claimed is:

1. A shift register unit, comprising: an input circuit, a reset circuit, a control circuit, a pull-down circuit and an output circuit, the shift register unit operating in four successive phases, wherein a first control terminal of the input circuit and the input terminal of the input circuit are coupled to a signal input terminal, respectively, a second control terminal of the input circuit is coupled to a first clock signal terminal, the output terminal of the input circuit is coupled to a first node, and the input circuit is configured to provide a signal of the signal input terminal to the first node under the control of the first clock signal terminal and the signal input terminal in the first phase of said four successive phases, the control terminal of the reset circuit is coupled to a reset signal terminal, the input terminal of the reset circuit is coupled to a reference signal terminal, a first output terminal of the reset circuit is coupled to the first node, a second output terminal of the reset circuit is coupled to a signal output terminal, and the reset circuit is configured to provide a signal of the reference signal terminal to the first node and the signal output terminal under the control of the reset signal terminal in the third phase of said four successive phases, respectively, a first control terminal of the control circuit is coupled to the first node, a first input terminal of the control circuit is coupled to the reference signal terminal, a first output terminal of the control circuit is coupled to a second node, a second control terminal of the control circuit and a second input terminal of the control circuit are coupled to the first clock signal terminal, respectively, a second output terminal of the control circuit is coupled to the second node, and the control circuit is configured to provide the signal of the reference signal terminal to the second node under the control of the first node in the second phase of said four successive phases and providing a signal of the first clock signal terminal to the second node under the control of the first clock signal terminal in the first, third and fourth phases of said four successive phases, a first control terminal of the output circuit is coupled to the first node, a first input terminal of the output circuit is coupled to a second clock signal terminal, a first output terminal of the output circuit is coupled to the signal output terminal, a second control terminal of the output circuit is coupled to the second node, a second input terminal of the output circuit is coupled to the reference signal terminal, a second output terminal of the output circuit is coupled to the first node, a third output terminal of the output circuit is coupled to the signal output terminal, and the output circuit is configured to provide a signal of the second clock signal terminal to the signal output terminal under the control of the first node in the second phase of said four successive phases and providing the signal of the reference signal terminal to the first node and the signal output terminal under the control of the second node in the first, third and fourth phases of said four successive phases, respectively, and both terminals of the pull-down circuit are coupled to the first clock signal terminal and the first node, respectively, and the pull-down circuit is configured to pull down the potential of the first node when the potential of the second clock signal terminal rises.

2. The shift register unit as claimed in claim 1, wherein the pull-down circuit specifically comprises a first capacitor, and both terminals of the first capacitor are coupled to the first clock signal terminal and the first node, respectively.

3. The shift register unit as claimed in claim 2, wherein the output circuit specifically comprises a first output circuit and a second output circuit, wherein the control terminal of the first output circuit is coupled to the first node, the input terminal of the first output circuit is coupled to the second clock signal terminal, the output terminal of the first output circuit is coupled to the signal output terminal, and the first output circuit is configured to provide the signal of the second clock signal terminal to the signal output terminal under the control of the first node, and the control terminal of the second output circuit is coupled to the second node, the input terminal of the second output circuit is coupled to the reference signal terminal, a first output terminal of the second output circuit is coupled to the first node, a second output terminal of the second output circuit is coupled to the signal output terminal, and the second output circuit is configured to provide the signal of the reference signal terminal to the first node and the signal output terminal under the control of the second node, respectively.

4. The shift register unit as claimed in claim 3, wherein the first output circuit specifically comprises a first switch transistor and a second capacitor, wherein the gate of the first switch transistor is coupled to the first node, the source of the first switch transistor is coupled to the second clock signal terminal, and the drain of the first switch transistor is coupled to the signal output terminal, and the second capacitor is connected between the gate and the drain of the first switch transistor.

5. The shift register unit as claimed in claim 4, wherein the range of ratio of the capacitance value of the first capacitor and the capacitance value of the second capacitor is 0.8 to 1.2.

6. The shift register unit as claimed in claim 3, wherein the second output circuit specifically comprises a second switch transistor and a third switch transistor, wherein the gate of the second switch transistor is coupled to the second node, the source of the second switch transistor is coupled to the reference signal terminal, and the drain of the second switch transistor is coupled to the first node, and the gate of the third switch transistor is coupled to the second node, the source of the third switch transistor is coupled to the reference signal terminal, and the drain of the third switch transistor is coupled to the signal output terminal.

7. The shift register unit as claimed in claim 3, wherein the output circuit further comprises a third output circuit, and the control terminal of the third output circuit is coupled to the first clock signal terminal, the input terminal of the third output circuit is coupled to the reference signal terminal, the output terminal of the third output circuit is coupled to the signal output terminal, and the third output circuit is configured to provide the signal of the reference signal terminal to the signal output terminal under the control of the first clock signal terminal.

8. The shift register unit as claimed in claim 7, wherein the third output circuit specifically comprises a fourth switch transistor, and the gate of the fourth switch transistor is coupled to the first clock signal terminal, the source of the fourth switch transistor is coupled to the reference signal terminal, and the drain of the fourth switch transistor is coupled to the signal output terminal.

9. The shift register unit as claimed in claim 1, wherein the input circuit specifically comprises a fifth switch transistor and a sixth switch transistor, wherein the gate and the source of the fifth switch transistor are coupled to the signal input terminal, respectively, and the drain of the fifth switch transistor is coupled to the first node, and the gate of the sixth switch transistor is coupled to the first clock signal terminal, the source of the sixth switch transistor is coupled to the signal input terminal, and the drain of the sixth switch transistor is coupled to the first node.

10. The shift register unit as claimed in claim 1, wherein the reset circuit specifically comprises a seventh switch transistor and an eighth switch transistor, wherein the gate of the seventh switch transistor is coupled to the reset signal terminal, the source of the seventh switch transistor is coupled to the reference signal terminal, and the drain of the seventh switch transistor is coupled to the first node, and the gate of the eighth switch transistor is coupled to the reset signal terminal, the source of the eighth switch transistor is coupled to the reference signal terminal, and the drain of the eighth switch transistor is coupled to the signal output terminal.

11. The shift register unit as claimed in claim 1, wherein the control circuit specifically comprises a first control circuit and a second control circuit, wherein the control terminal of the first control circuit is coupled to the first node, the input terminal of the first control circuit is coupled to the reference signal terminal, the output terminal of the first control circuit is coupled to the second node, and the first control circuit is configured to provide the signal of the reference signal terminal to the second node under the control of the first node, and the control terminal and the input terminal of the second control circuit are coupled to the first clock signal terminal, respectively, the output terminal of the second control circuit is coupled to the second node, and the second control circuit is configured to provide the signal of the first clock signal terminal to the second node under the control of the first clock signal terminal.

12. The shift register unit as claimed in claim 11, wherein the first control circuit specifically comprises a ninth switch transistor and a tenth switch transistor, wherein the gate of the ninth switch transistor is coupled to the first node, the source of the ninth switch transistor is coupled to the reference signal terminal, and the drain of the ninth switch transistor is coupled to the second node, and the gate of the tenth switch transistor is coupled to the first node, the source of the tenth switch transistor is coupled to the reference signal terminal, and the drain of the tenth switch transistor is coupled to a third node.

13. The shift register unit as claimed in claim 11, wherein the second control circuit specifically comprises an eleventh switch transistor and a twelfth switch transistor, wherein the gate and the source of the eleventh switch transistor are coupled to the first clock signal terminal, respectively, and the drain of the eleventh switch transistor is coupled to the third node, and the gate of the twelfth switch transistor is coupled to the third node, the source of the twelfth switch transistor is coupled to the first clock signal terminal, and the drain of the twelfth switch transistor is coupled to the second node.

14. A gate driving circuit, comprising a plurality of cascaded shift register units as claimed in claim 1, wherein except for the shift register unit at the first stage, the signal output terminal of the shift register unit at each of the rest stages is coupled to the reset signal terminal of the shift register unit at a previous stage which is adjacent to it, respectively, except for the shift register unit at the last stage, the signal output terminal of the shift register unit at each of the rest stages is coupled to the signal input terminal of the shift register unit at a next stage which is adjacent to it, respectively, and the signal input terminal of the shift register unit at the first stage is coupled to a frame state signal terminal.

15. A display device, comprising a gate driving circuit as claimed in claim 14.

16. A driving method of a shift register unit as claimed in claim 1, comprising:
- at a first phase, providing a signal of the signal input terminal to the first node under the control of the signal input terminal, and providing a signal of the second clock signal terminal to the signal output terminal under the control of the first node, and providing a signal of the first clock signal terminal to the second node under the control of the first clock signal terminal, and providing a signal of the reference signal terminal to the first node and the signal output terminal under the second node, respectively,
- at a second phase, providing the signal of the second clock signal terminal to the signal output terminal under the control of the first node, and providing the signal of the reference signal terminal to the second node under the control of the first node,
- at a third phase, providing the signal of the reference signal terminal to the first node and the signal output terminal under the control of the reset signal terminal, respectively, and providing the signal of the first clock signal terminal to the second node under the control of the first clock signal terminal, and providing the signal of the reference signal terminal to the first node and the signal output terminal under the second node, respectively, and
- at a fourth phase, pulling down the potential of the first node when the potential of the second clock signal terminal rises, and providing the signal of the first clock signal terminal to the second node under the control of the first clock signal terminal, and providing the signal of the reference signal terminal to the first node and the signal output terminal under the second node, respectively.

17. The driving method as claimed in claim 16, further comprising:
- at the first phase and the third phase, providing the signal of the reference signal terminal to the signal output terminal under the control of the first clock signal terminal.

18. The driving method as claimed in claim 16, wherein the pull-down circuit specifically comprises a first capacitor, and
- both terminals of the first capacitor are coupled to the first clock signal terminal and the first node, respectively.

19. The driving method as claimed in claim 17, wherein the output circuit specifically comprises a first output circuit and a second output circuit, wherein
- the control terminal of the first output circuit is coupled to the first node, the input terminal of the first output circuit is coupled to the second clock signal terminal, the output terminal of the first output circuit is coupled to the signal output terminal, and the first output circuit is configured to provide the signal of the second clock signal terminal to the signal output terminal under the control of the first node, and
- the control terminal of the second output circuit is coupled to the second node, the input terminal of the second output circuit is coupled to the reference signal terminal, a first output terminal of the second output circuit is coupled to the first node, a second output terminal of the second output circuit is coupled to the signal output terminal, and the second output circuit is configured to provide the signal of the reference signal terminal to the first node and the signal output terminal under the control of the second node, respectively.

20. The driving method as claimed in claim 19, wherein the first output circuit specifically comprises a first switch transistor and a second capacitor, wherein the gate of the first switch transistor is coupled to the first node, the source of the first switch transistor is coupled to the second clock signal terminal, and the drain of the first switch transistor is coupled to the signal output terminal, and
- the second capacitor is connected between the gate and the drain of the first switch transistor.

* * * * *